United States Patent
Shea et al.

(10) Patent No.: US 8,119,537 B2
(45) Date of Patent: Feb. 21, 2012

(54) SELECTIVE ETCHING OF OXIDES TO METAL NITRIDES AND METAL OXIDES

(75) Inventors: Kevin R. Shea, Boise, ID (US); Kevin J. Torek, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 158 days.

(21) Appl. No.: 11/155,809

(22) Filed: Jun. 17, 2005

(65) Prior Publication Data
US 2006/0046513 A1   Mar. 2, 2006

Related U.S. Application Data

(60) Provisional application No. 60/606,604, filed on Sep. 2, 2004.

(51) Int. Cl.
H01L 21/302 (2006.01)
(52) U.S. Cl. ......... 438/756; 438/723; 438/745; 216/100
(58) Field of Classification Search .................. 438/706, 438/710, 714, 754, 756, 757, 740, 745, 723; 216/67, 72, 73, 75, 79, 99, 100
See application file for complete search history.

(56) References Cited

U.S. PATENT DOCUMENTS

| | | | |
|---|---|---|---|
| 4,230,523 A | 10/1980 | Gajda | |
| 5,320,709 A * | 6/1994 | Bowden et al. | 438/745 |
| 5,733,689 A * | 3/1998 | Ogihara et al. | 430/5 |
| 5,846,880 A * | 12/1998 | Lee | 438/669 |
| 5,990,019 A | 11/1999 | Torek et al. | |
| 6,074,900 A * | 6/2000 | Yamazaki et al. | 438/164 |
| 6,200,891 B1 | 3/2001 | Jagannathan et al. | |
| 6,372,657 B1 | 4/2002 | Hineman et al. | |
| 6,383,410 B1 | 5/2002 | Wojtczak et al. | |
| 6,492,309 B1 | 12/2002 | Behr et al. | |
| 6,613,680 B2 * | 9/2003 | Tohda et al. | 438/703 |
| 6,667,244 B1 * | 12/2003 | Cox et al. | 438/712 |
| 6,828,289 B2 * | 12/2004 | Peters et al. | 510/175 |
| 6,841,396 B2 * | 1/2005 | Celii et al. | 438/3 |
| 6,890,863 B1 * | 5/2005 | Donohoe et al. | 438/714 |
| 7,132,370 B2 * | 11/2006 | Paraschiv et al. | 438/756 |
| 7,192,860 B2 * | 3/2007 | McFarland et al. | 438/612 |

(Continued)

FOREIGN PATENT DOCUMENTS

JP          59-011630     *   1/1984

(Continued)

OTHER PUBLICATIONS

"Niobium mononitride edge junction fabrication: edge profile control by reactive ion etching"; Meng et. al.; IEEE Transactions on Magnetics (1989'); 25(2); 1239-1242.*

(Continued)

*Primary Examiner* — Lan Vinh
(74) *Attorney, Agent, or Firm* — Wells St. John P.S.

(57) ABSTRACT

A method is provided for selectively etching native oxides or other contaminants to metal nitrides and metal oxides during manufacture of a semiconductor device. The method utilizes a substantially non-aqueous etchant which includes a source of fluorine ions. In a preferred embodiment, the etchant comprises $H_2SO_4$ and HF. The etchant selectively etches native and doped oxides or other contaminants without excessively etching metal nitrides or metal oxides on the substrate or on adjacent exposed surfaces.

10 Claims, 5 Drawing Sheets

U.S. PATENT DOCUMENTS

| | | | |
|---|---|---|---|
| 2002/0151168 A1* | 10/2002 | Wang et al. | 438/624 |
| 2002/0192915 A1* | 12/2002 | Wada et al. | 438/305 |
| 2003/0087532 A1* | 5/2003 | Wu et al. | 438/745 |
| 2003/0235986 A1* | 12/2003 | Sievert et al. | 438/689 |
| 2004/0013858 A1* | 1/2004 | Hacker et al. | 428/195.1 |
| 2004/0192046 A1* | 9/2004 | McFarland et al. | 438/689 |
| 2004/0253898 A1* | 12/2004 | Teramoto | 445/50 |

FOREIGN PATENT DOCUMENTS

| | | | |
|---|---|---|---|
| JP | 10-209124 | * | 8/1998 |
| JP | 2000-357734 | * | 12/2000 |
| JP | 2001-196376 | * | 7/2001 |
| JP | 2001-196377 | * | 7/2001 |

OTHER PUBLICATIONS

"Characterization of residues on anhydrous HF gas-phase etching of sacrificial oxides for surface machining"; Jang et. al.; (2000'); Japanese Journal of Applied Physics, Part 1; 39 (1); pp. 337-342.*

S. Rondinini et al., "pH Measurements in Non-Aqueous and Mixed Solvents: Predicting pH(PS) of Potassium Hydrogen Phthalate for Alcohol-Water Mixtures," Pure & Appl. Chem., vol. 70, No. 7, pp. 1419-1422, 1998, Great Britain.

R.P. Buck et al., "Measurement of pH. Definition, Standards, and Procedures," Pure Appl. Chem., vol. 74, No. 11, pp. 2169-2200, 2002.

* cited by examiner

SELECTIVE ETCHING OF OXIDES TO METAL NITRIDES AND METAL OXIDES

CROSS REFERENCE TO RELATED APPLICATIONS

This application claims the benefit of U.S. Provisional Application Ser. No. 60/606,604 filed Sep. 2, 2004.

BACKGROUND OF THE INVENTION

The present invention relates to the manufacture of semiconductor devices. More particularly, the present invention is directed to methods for selectively etching oxides to metal nitrides and metal oxides during manufacture of a semiconductor device.

During manufacture of components such as capacitors for use in semiconductor devices, there are many circumstances in which it is desirable to perform cleaning operations to remove native oxides or other oxide contaminants from one or more exposed surfaces. For example, when forming a double-sided container for a capacitor, a polysilicon or metal contact plug is formed. This is followed by deposition of an oxide layer such as BPSG (borophosphosilicate glass). Using conventional masking techniques, a container structure is formed by etching through the oxide layer to the contact plug. A spacer (sacrificial liner) formed of a metal oxide such as aluminum oxide is deposited along the container walls.

The spacer is then punched through using a plasma etch process to expose the contact plug, followed by deposition of a bottom electrode comprising a polysilicon, metal, or metal nitride. A chemical mechanical planarization (CMP) process is then used to planarize the surface, followed by deposition of a dielectric layer. However, when the spacer/liner is punched into the polysilicon layer, typically a contact clean must be performed to remove native oxide contaminants from the contact plug prior to deposition of the bottom electrode. Otherwise, the presence of native oxide on the contact could potentially inhibit current flow.

It is also desirable to perform a precleaning step when metal nitrides are used as the bottom electrode. A precleaning step is also desirable when forming a nano-laminate dielectric, where it is desirable to pre-clean the first dielectric material before a second dielectric material is deposited. Typically, aqueous etching solutions comprising HF or $NH_4F$ have been used in such cleaning operations. However, such solutions often result in the over etching of adjacent layers including the metal oxides or metal nitrides which comprise the sacrificial liner, bottom electrode, or other layers.

Accordingly, there is still a need in the art for a method of cleaning a substrate surface to remove native oxides and other contaminants without excessively attacking or removing metal oxides or metal nitrides from the substrate surface or adjacent exposed surfaces.

SUMMARY OF THE INVENTION

The present invention meets that need by providing a method for selectively etching a substrate to remove oxides such as native oxides or other contaminants without excessive removal of metal oxides or metal nitrides that either form the substrate surface or are exposed on adjacent surfaces of a semiconductor substrate.

According to one aspect of the present invention, a method for selectively etching an oxide in or on a substrate in the presence of metal oxides and/or metal nitrides is provided comprising exposing the oxide to a substantially non-aqueous etchant comprising a source of fluoride ions, said etchant having a pH of less than about 4.0.

By "substantially non-aqueous etchant" it is meant that the etchant contains less than about 1.0% water by weight. By "substrate" it is meant any semiconductor-based structure including silicon, silicon-on insulator (SOI), silicon-on sapphire (SOS), doped and undoped semiconductors, epitaxial layers of silicon supported by a base semiconductor foundation, and other semiconductor structures. The substrate need not be silicon-based. The semiconductor could be silicon-germanium or germanium. When reference is made to a "substrate" in this description, previous process steps may have been utilized to form regions or junctions in or on the base semiconductor.

In one embodiment of the invention, the substantially non-aqueous etchant comprises an organic solvent and ammonium fluoride. In a more preferred embodiment, the etchant further comprises ammonium hydroxide. The organic solvent preferably comprises isopropyl alcohol, but may include other organic solvents such as, for example, other alcohols and glycols, carboxylic acids, and ethers.

In an alternative embodiment of the invention, the substantially non-aqueous etchant comprises dilute hydrogen fluoride (i.e., <5% by volume), an organic solvent, and ammonium fluoride.

In yet another embodiment of the invention, the substantially non-aqueous etchant comprises acetic acid and hydrogen fluoride.

In yet another embodiment of the invention, the substantially non-aqueous etchant comprises a fluorinated gas source. In this embodiment, the gas source is preferably introduced by injection downstream from $H_2$ which has been exposed to a microwave plasma source.

In yet another embodiment of the invention, the substantially non-aqueous etchant comprises a vapor phase solution containing hydrogen fluoride.

In another preferred embodiment of the invention, the substantially non-aqueous etchant comprises sulfuric acid and hydrogen fluoride.

The method of the present invention provides for the selective etching and removal of doped oxides such as BPSG, BSG, PSG and native oxides from surfaces of the semiconductor substrate without excessively attacking metal nitrides and metal oxides such as HfN, AlN, and $Al_2O_3$ which are present on the substrate or which may be present on exposed adjacent surfaces of the substrate.

Accordingly, it is a feature of the present invention to provide a method for selectively etching oxides to metal nitrides and metal oxides on a semiconductor substrate surface without attacking or excessively removing the metal nitrides or metal oxides. Other features and advantages of the invention will be apparent from the following description, the accompanying drawings, and the appended claims.

DETAILED DESCRIPTION OF THE PREFERRED EMBODIMENTS

Figure 1:
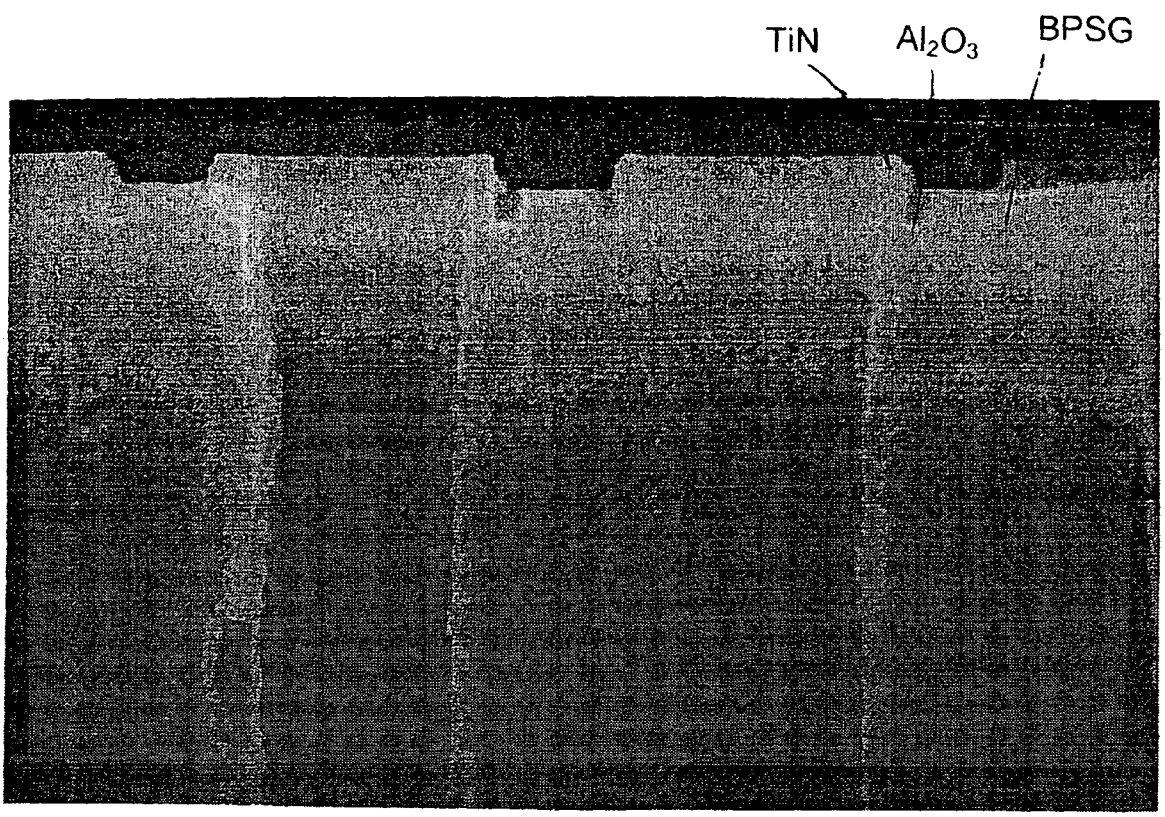
FIG. 1 is a photomicrograph of a sectional side view of a portion of a semiconductor substrate with a contact opening which has been etched using a substantially non-aqueous etchant in accordance with an embodiment of the present invention.

The methods used in embodiments of the present invention provide substantially non-aqueous etchants having improved characteristics over conventional aqueous etchants. We have found that by using substantially non-aqueous etchants having a low pH and low water content (i.e., less than about 1% by weight), oxides such as doped or native oxides and other contaminants can be selectively etched to metal nitrides and metal oxides without substantial damage to the substrate surface or exposed adjacent surfaces containing such metal nitrides and metal oxides. Without wishing to advance or to rely on any specific theory, the selective activity is believed to be due to achieving control of the dissociation of fluorine contained in HF or $NH_4F$ by utilizing strong acids and/or organic solvents instead of water.

By using substantially non-aqueous etchants, high selectivities in etch rates between oxides and metal oxides and metal nitrides may be achieved. Typically, when using substantially non-aqueous etchants in accordance with embodiments of the present invention, selectivities of from between about 1 to about 100 may be achieved.

Where the substantially non-aqueous etchant includes an organic solvent, the solvent preferably comprises isopropyl alcohol. However, other suitable organic solvents for use in the present invention include other alcohols and glycols, carboxylic acids, and ethers.

One useful substantially non-aqueous etchant is a mixture of isopropyl alcohol and $NH_4F$. We have found that this etchant is particularly beneficial in a container capacitor cleaning step where HfN has been used as the sacrificial liner. This etchant is commonly referred to as a non-selective etchant and is commercially available from Daikin Industries, Ltd. under the designation NSE/DCIF-10. The etchant comprises 99% isopropyl alcohol, 0.5% water, 600 ppm (0.06%) fluoride ions (F) and 300 ppm (0.03%) ammonium ions ($NH_4+$).

Another preferred substantially non-aqueous etchant comprises a mixture of about 95 wt. % $H_2SO_4$ and about 5 wt. % HF. This etchant is suitable for the selective removal of oxides such as native oxides in the presence of metal nitrides and metal oxides including HfN, AlN, and $Al_2O_3$.

Other suitable substantially non-aqueous etchants include mixtures of isopropyl alcohol, less than or equal to about 5% by wt. $NH_4F$, and dilute HF (less than or equal to about 5% wt. % HF); mixtures of isopropyl alcohol, less than or equal to about 5 wt. % $NH_4F$, and less than or equal to about 10 wt. % $NH_4OH$; and mixtures of acetic acid and HF.

Dry plasma etchants may also be used in other embodiments of the invention. One such suitable etchant is a fluorinated gas source. This etchant is preferably used in applications to clean the surfaces of polysilicon plugs where the etchant selectively etches native oxides but does not etch aluminum oxide or hafnium nitride (HfN) liners. Preferably, the fluorine gas is injected downstream from plasma-exposed $H_2$ and is entrained in the hydrogen plasma stream.

The etchant may also be in the form of a vapor phase solution comprising HF. In this embodiment, the HF preferably has a purity of about 99% or greater.

The substantially non-aqueous etchants of embodiments of the present invention may be used in a number of different cleaning operations. For example, when metal nitrides such as TiN or HfN comprise a bottom electrode in a container capacitor structure, the etchants may be used to perform a pre-cleaning of the container surfaces to remove oxides and other contaminants. The etchants may also be used when creating a nano-laminate dielectric structure, where the first dielectric layer requires cleaning before the second dielectric layer is deposited. It is also desirable to perform a cleaning operation to remove native oxides when metal oxides are used as the sacrificial liner for a double-sided capacitor containers. The substantially non-aqueous etchants are applied in a manner conventional in this art and are removed by conventional rinsing techniques.

In order that the invention may be more readily understood, reference is made to the following examples which are intended to illustrate the invention, but not limit the scope thereof.

Example 1

In a set of experiments which are described below with reference to FIGS. 1-5, a first silicon substrate 10 with a contact opening 20 formed into a BPSG layer was etched with four different substantially non-aqueous etchants in accordance with embodiments of the present invention to facilitate the removal of native oxides from the bottom of the contact opening 20. FIG. 1 is a photomicrograph showing the contact opening after etching with an substantially non-aqueous etchant comprising isopropyl alcohol, $NH_4F$ and dilute HF (concentration less than about 1 wt % (approximately 600 ppm)). As can be seen, the BPSG substrate was selectively etched without excessively etching the aluminum oxide layer.

Example 2

Figure 2:
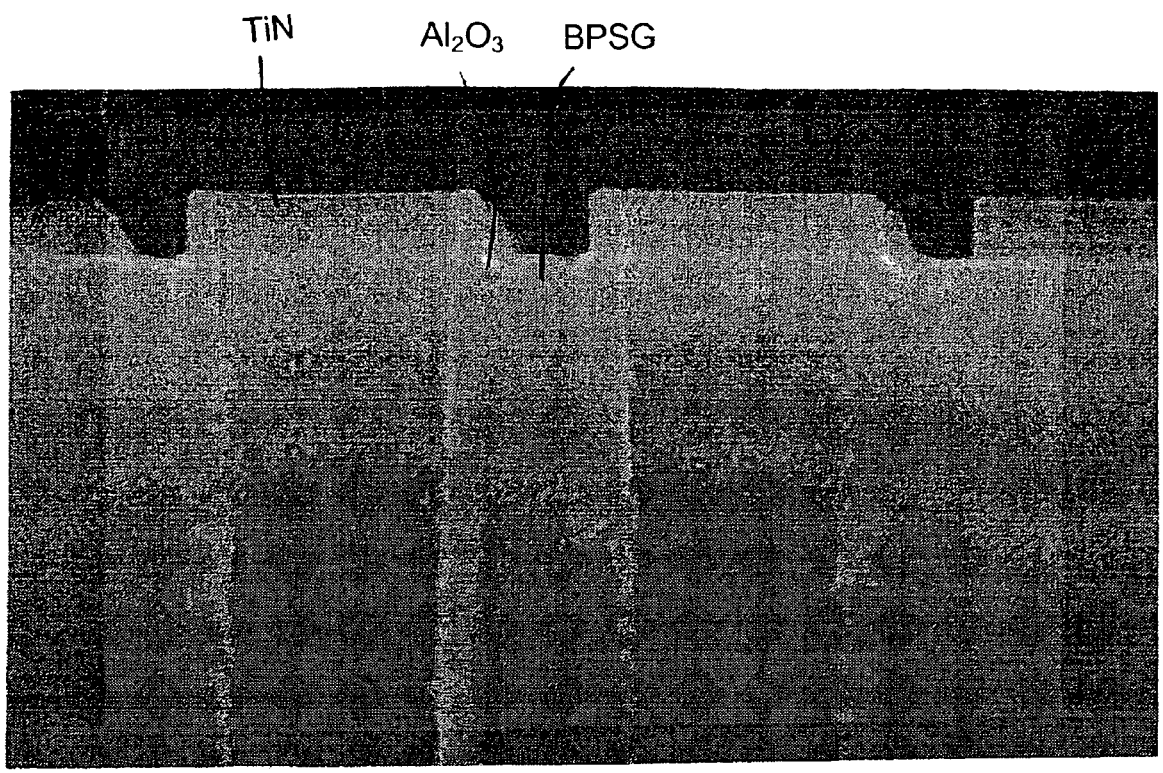
FIG. 2 is a photomicrograph of a sectional side view of a portion of a semiconductor substrate with a contact opening which has been etched using a substantially non-aqueous etchant in accordance with an embodiment of the present invention.

FIG. 2 is a photomicrograph of a contact opening after etching with a non-aqueous etchant comprising a mixture of isopropyl alcohol, $NH_4F$ and $NH_4OH$. Again, it can be seen that the doped oxides (BPSG) are selectively etched at a much faster rate than the metal oxide ($Al_2O_3$) or metal nitride (TiN) layers.

Example 3

Figure 3:
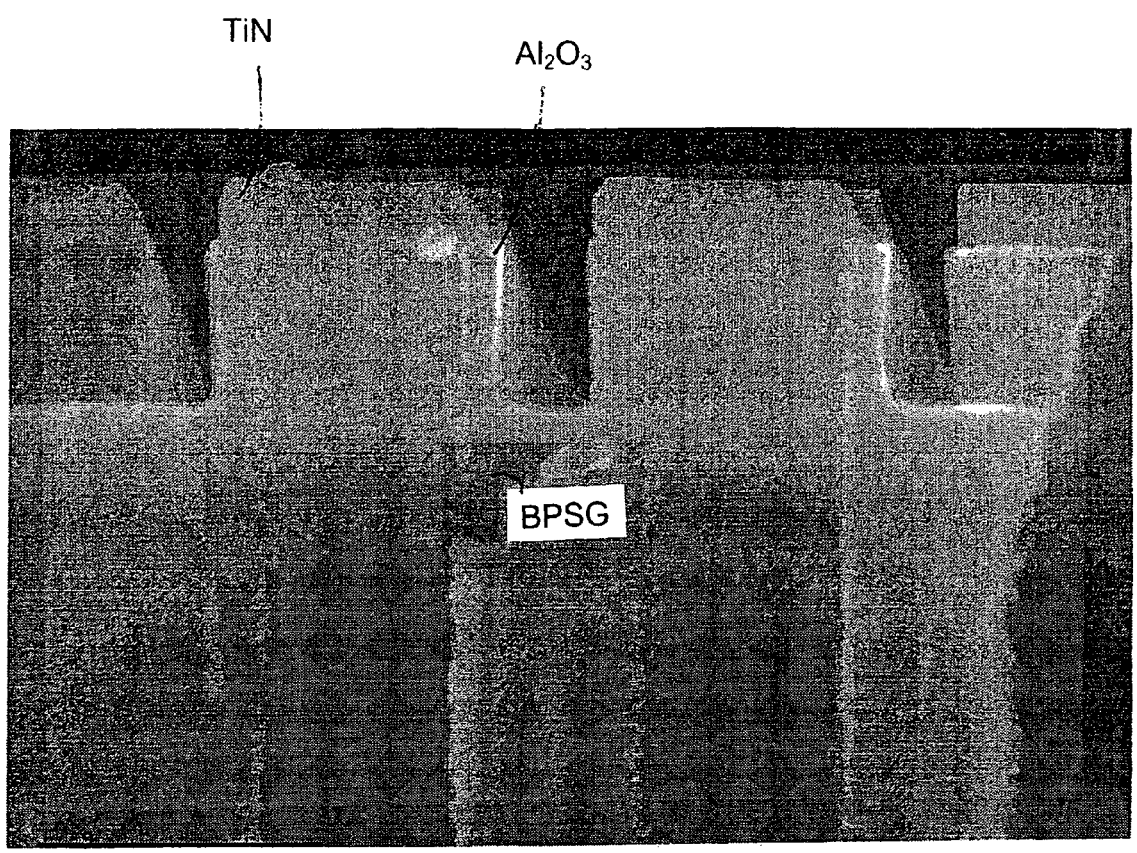
FIG. 3 is a photomicrograph of a sectional side view of a portion of a semiconductor substrate with a contact opening which has been etched using a substantially non-aqueous etchant in accordance with an embodiment of the present invention.

FIG. 3 is a photomicrograph of a contact opening after etching with a non-aqueous etchant comprising a mixture of $H_2SO_4$ and HF. Again, BPSG was selectively etched while the aluminum oxide liner was etched at a much lower rate.

Example 4

Figure 4:
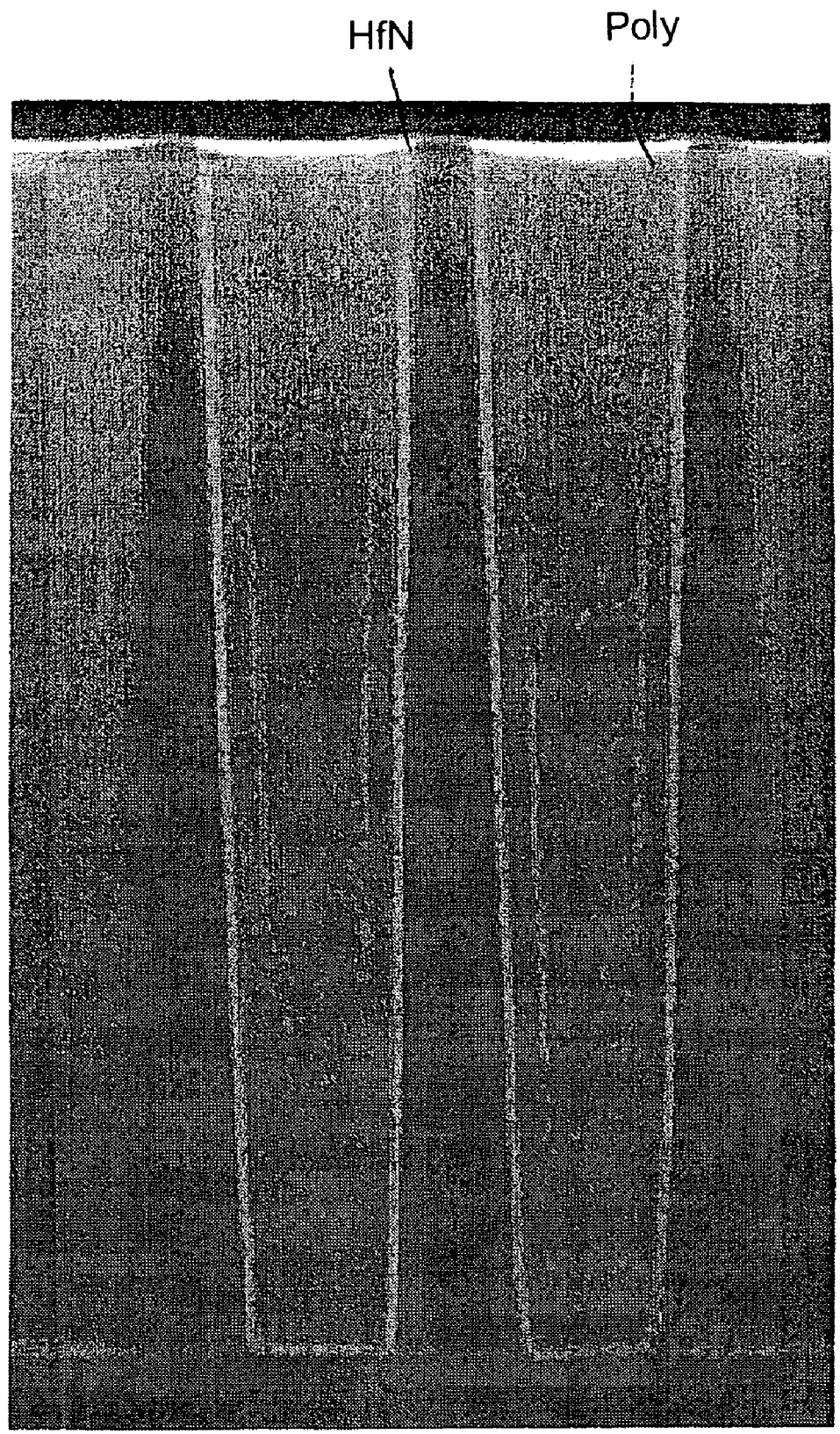
FIG. 4 is a photomicrograph of a sectional side view of a portion of a semiconductor substrate with a contact opening which has been etched using a substantially non-aqueous etchant in accordance with an embodiment of the present invention.

FIG. 4 is a photomicrograph of a contact opening which has been etched using a nonselective etchant comprising isopropyl alcohol and $NH_4F$. While we found that this etchant works efficiently in the presence of HfN, it is not preferred for etching in the presence of aluminum oxide or other metal oxides because of lower selectivity in etch rates.

Comparative Example

Figure 5:
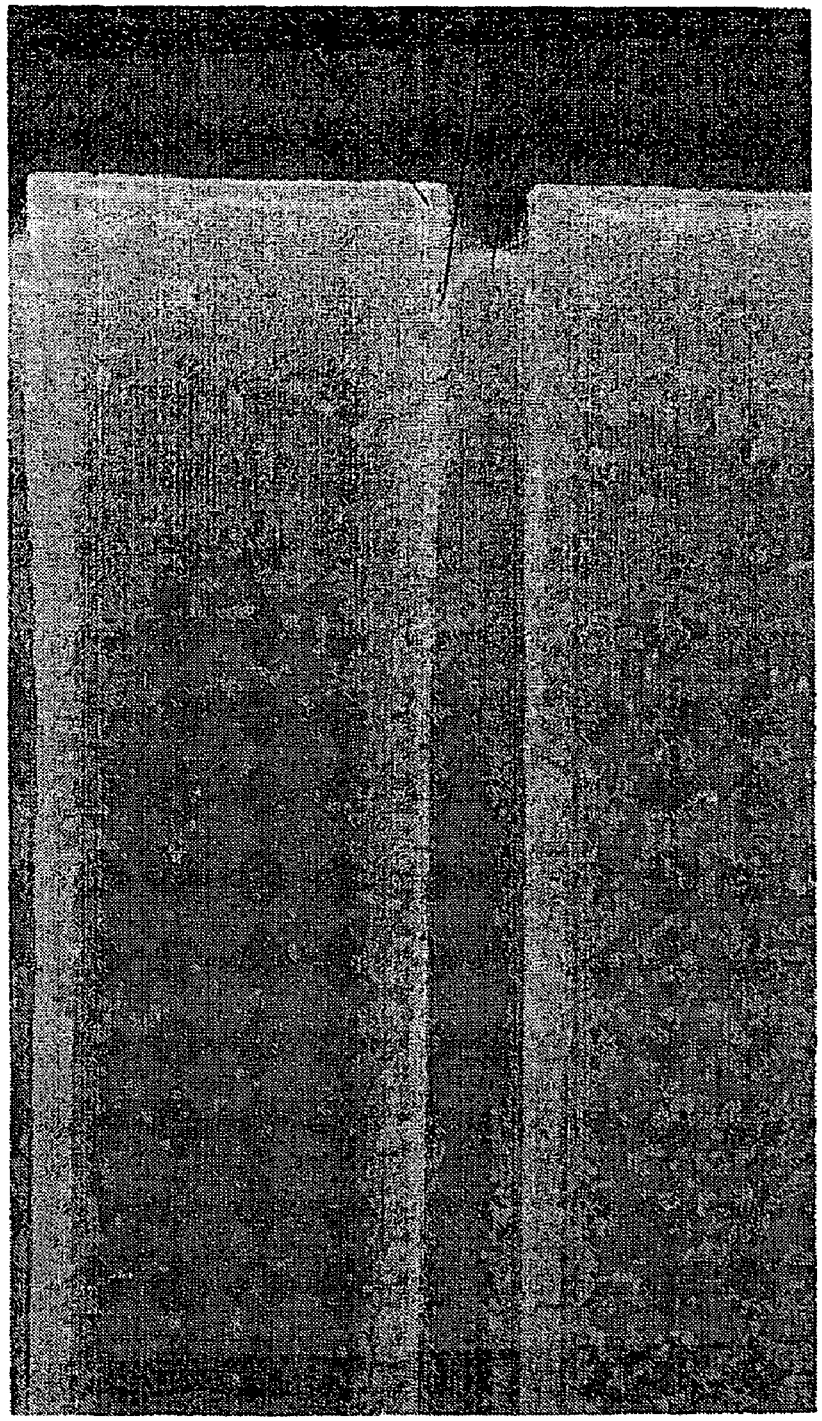
FIG. 5 is a photomicrograph of a sectional side view of a portion of a representative semiconductor substrate with a conventional contact opening which has been etched using a conventional aqueous-based etchant.

In a separate experiment which is described with reference to FIG. 5, a silicon substrate 10 with a contact opening 20 formed into a BPSG layer was etched using a conventional aqueous etchant (QEII, commercially available from Arch Chemicals) comprising $NH_4F$, phosphoric acid, and water. As can be seen, this commercial etchant was essentially non-selective causing the HfN liner to be excessively etched.

It will be apparent to those skilled in the art that various changes may be made without departing from the scope of the invention which is not considered limited to what is described in the specification.

What is claimed is:

1. A method for selectively etching silicon oxide on a semiconductor-based substrate surface in the presence of directly underlying or exposed surfaces of metal oxides and metal nitrides without attacking said metal oxides and metal nitrides comprising exposing the silicon oxide to a substantially non-aqueous etchant comprising a source of fluorine ions, said substantially non-aqueous etchant containing less than about 1.0% by weight water and having a H+ ion concentration of greater than $10^{-4}$ g moles of H+ ions per liter of etchant.

2. The method of claim 1 wherein said etchant comprises a mixture of an organic solvent and ammonium fluoride.

3. The method of claim 2 wherein said organic solvent comprises isopropyl alcohol.

4. The method of claim 2 wherein said etchant further comprises ammonium hydroxide.

5. The method of claim 1 wherein said etchant comprises dilute hydrogen fluoride, an organic solvent, and ammonium fluoride.

6. The method of claim 5 wherein said organic solvent comprises isopropyl alcohol.

7. The method of claim 1 wherein said etchant comprises sulfuric acid and hydrogen fluoride.

8. The method of claim 1 wherein said etchant comprises acetic acid and hydrogen fluoride.

9. The method of claim 1 wherein said etchant comprises a fluorinated gas plasma.

10. The method of claim 1 wherein said etchant comprises a vapor phase solution comprising hydrogen fluoride.

* * * * *